United States Patent
Bristol et al.

(10) Patent No.: US 9,406,512 B2
(45) Date of Patent: Aug. 2, 2016

(54) SELF-ALIGNED VIA PATTERNING WITH MULTI-COLORED PHOTOBUCKETS FOR BACK END OF LINE (BEOL) INTERCONNECTS

(71) Applicants: Robert L. Bristol, Portland, OR (US); James M. Blackwell, Portland, OR (US); Alan M. Myers, Beaverton, OR (US); Kanwal Jit Singh, Hillsboro, OR (US)

(72) Inventors: Robert L. Bristol, Portland, OR (US); James M. Blackwell, Portland, OR (US); Alan M. Myers, Beaverton, OR (US); Kanwal Jit Singh, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/720,821

(22) Filed: May 24, 2015

(65) Prior Publication Data
US 2015/0255284 A1    Sep. 10, 2015

Related U.S. Application Data

(62) Division of application No. 14/133,344, filed on Dec. 18, 2013, now Pat. No. 9,041,217.

(51) Int. Cl.
*H01L 21/033* (2006.01)
*H01L 21/768* (2006.01)
(Continued)

(52) U.S. Cl.
CPC ........ *H01L 21/0338* (2013.01); *H01L 21/0332* (2013.01); *H01L 21/0335* (2013.01);
(Continued)

(58) Field of Classification Search
None
See application file for complete search history.

(56) References Cited

U.S. PATENT DOCUMENTS

| 6,365,504 B1 | 4/2002 | Chien et al. |
| 7,939,445 B1 | 5/2011 | Sutardja et al. |

(Continued)

FOREIGN PATENT DOCUMENTS

| JP | 2009-016814 | 1/2009 |
| TW | 201250920 | 12/2012 |
| WO | WO-2013/101096 | 7/2013 |

OTHER PUBLICATIONS

International Search Report and Written Opinion from PCT/US2014/063128 mailed Jan. 29, 2015, 10 pgs.

(Continued)

*Primary Examiner* — Erik Kielin
(74) *Attorney, Agent, or Firm* — Blakely, Sokoloff, Taylor & Zafman LLP (57) ABSTRACT

Self-aligned via patterning with multi-colored photobuckets for back end of line (BEOL) interconnects is described. In an example, an interconnect structure for an integrated circuit includes a first layer of the interconnect structure disposed above a substrate, the first layer including a first grating of alternating metal lines and dielectric lines in a first direction. The dielectric lines have an uppermost surface higher than an uppermost surface of the metal lines. A second layer of the interconnect structure is disposed above the first layer of the interconnect structure, the second layer including a second grating of alternating metal lines and dielectric lines in a second direction, perpendicular to the first direction. The dielectric lines have a lowermost surface lower than a lowermost surface of the metal lines of the second grating. The dielectric lines of the second grating overlap and contact, but are distinct from, the dielectric lines of the first grating. First and second dielectric regions are disposed between the metal lines of the first grating and the metal lines of the second grating, and in a same plane as upper portions of the dielectric lines of the first grating and lower portions of the dielectric lines of the second grating. The first dielectric region is composed of a first cross-linked photolyzable material, and the second dielectric region is composed of a second, different, cross-linked photolyzable material.

16 Claims, 9 Drawing Sheets

(51) Int. Cl.
*H01L 23/522* (2006.01)
*H01L 23/528* (2006.01)
*H01L 23/532* (2006.01)

(52) U.S. Cl.
CPC ...... *H01L21/0337* (2013.01); *H01L 21/76801* (2013.01); *H01L 21/76808* (2013.01); *H01L 21/76811* (2013.01); *H01L 21/76813* (2013.01); *H01L 21/76816* (2013.01); *H01L 21/76897* (2013.01); *H01L 23/528* (2013.01); *H01L 23/5226* (2013.01); *H01L 23/53295* (2013.01); *H01L 2924/0002* (2013.01)

(56) References Cited

U.S. PATENT DOCUMENTS

| | | | |
|---|---|---|---|
| 8,852,851 | B2 | 10/2014 | Zhou et al. |
| 9,054,164 | B1 * | 6/2015 | Jezewski ........... H01L 21/76879 |
| 9,209,077 | B2 * | 12/2015 | Myers ............... H01L 21/76879 |
| 9,236,292 | B2 * | 1/2016 | Romero ............ H01L 21/76838 |
| 9,236,342 | B2 * | 1/2016 | Bristol ................. H01L 23/522 |
| 9,252,188 | B2 * | 2/2016 | Tang ................... H01L 27/2463 |
| 2009/0200683 | A1 | 8/2009 | Colburn et al. |
| 2010/0112496 | A1 | 5/2010 | Nakajima et al. |
| 2012/0302057 | A1 | 11/2012 | Arnold et al. |
| 2012/0313251 | A1 | 12/2012 | Kato |
| 2013/0126816 | A1 * | 5/2013 | Tang ................... H01L 27/2463 257/3 |
| 2015/0093702 | A1 * | 4/2015 | Nyhus ................... G03F 7/0392 430/270.1 |
| 2015/0170961 | A1 * | 6/2015 | Romero ............ H01L 21/76838 438/641 |
| 2015/0171010 | A1 * | 6/2015 | Bristol ................. H01L 23/522 257/774 |
| 2015/0179513 | A1 * | 6/2015 | Myers ............... H01L 21/76879 257/774 |
| 2015/0179515 | A1 * | 6/2015 | Jezewski ........... H01L 21/76879 257/774 |
| 2015/0243599 | A1 * | 8/2015 | Jezewski ........... H01L 21/76879 257/774 |
| 2015/0255284 | A1 * | 9/2015 | Bristol ................. H01L 23/528 257/774 |
| 2016/0086850 | A1 * | 3/2016 | Romero ............ H01L 21/76838 438/675 |

OTHER PUBLICATIONS

Office Action and Search Report from Taiwan Patent Application No. 103137441 mailed Nov. 26, 2015, 7 pgs.

* cited by examiner

SELF-ALIGNED VIA PATTERNING WITH MULTI-COLORED PHOTOBUCKETS FOR BACK END OF LINE (BEOL) INTERCONNECTS

CROSS-REFERENCE TO RELATED APPLICATIONS

This application is a Divisional of U.S. patent application Ser. No. 14/133,344, filed on Dec. 18, 2013, the entire contents of which are hereby incorporated by reference herein.

TECHNICAL FIELD

Embodiments of the invention are in the field of semiconductor structures and processing and, in particular, self-aligned via patterning with multi-colored photobuckets for back end of line (BEOL) interconnects.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Integrated circuits commonly include electrically conductive microelectronic structures, which are known in the arts as vias, to electrically connect metal lines or other interconnects above the vias to metal lines or other interconnects below the vias. Vias are typically formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via.

In the past, the sizes and the spacing of vias has progressively decreased, and it is expected that in the future the sizes and the spacing of the vias will continue to progressively decrease, for at least some types of integrated circuits (e.g., advanced microprocessors, chipset components, graphics chips, etc.). One measure of the size of the vias is the critical dimension of the via opening. One measure of the spacing of the vias is the via pitch. Via pitch represents the center-to-center distance between the closest adjacent vias.

When patterning extremely small vias with extremely small pitches by such lithographic processes, several challenges present themselves, especially when the pitches are around 70 nanometers (nm) or less and/or when the critical dimensions of the via openings are around 35 nm or less. One such challenge is that the overlay between the vias and the overlying interconnects, and the overlay between the vias and the underlying landing interconnects, generally need to be controlled to high tolerances on the order of a quarter of the via pitch. As via pitches scale ever smaller over time, the overlay tolerances tend to scale with them at an even greater rate than lithographic equipment is able to keep up.

Another such challenge is that the critical dimensions of the via openings generally tend to scale faster than the resolution capabilities of the lithographic scanners. Shrink technologies exist to shrink the critical dimensions of the via openings. However, the shrink amount tends to be limited by the minimum via pitch, as well as by the ability of the shrink process to be sufficiently optical proximity correction (OPC) neutral, and to not significantly compromise line width roughness (LWR) and/or critical dimension uniformity (CDU).

Yet another such challenge is that the LWR and/or CDU characteristics of photoresists generally need to improve as the critical dimensions of the via openings decrease in order to maintain the same overall fraction of the critical dimension budget. However, currently the LWR and/or CDU characteristics of most photoresists are not improving as rapidly as the critical dimensions of the via openings are decreasing.

A further such challenge is that the extremely small via pitches generally tend to be below the resolution capabilities of even extreme ultraviolet (EUV) lithographic scanners. As a result, commonly two, three, or more different lithographic masks may be used, which tend to increase the costs. At some point, if pitches continue to decrease, it may not be possible, even with multiple masks, to print via openings for these extremely small pitches using EUV scanners.

Thus, improvements are needed in the area of via manufacturing technologies.

BRIEF DESCRIPTION OF THE DRAWINGS

FIGS. 1A-1H illustrate portions of integrated circuit layers representing various operations in a method of subtractive self-aligned via patterning using multi-colored photobuckets, in accordance with an embodiment of the present invention, where:

FIGS. 3A-3I illustrate portions of integrated circuit layers representing various operations in a method of subtractive self-aligned via patterning using multi-colored photobuckets, in accordance with another embodiment of the present invention, where:

DESCRIPTION OF THE EMBODIMENTS

Self-aligned via patterning with multi-colored photobuckets for back end of line (BEOL) interconnects is described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to the use of multicolored photobuckets as an approach for addressing plug and via fabrication below the lithography pitch limit. One or more embodiments described herein are directed to subtractive approaches for self-aligned via and plug patterning, and structures resulting there from. In an embodiment, processes described herein enable realization of self-aligned metallization for back-end of line feature fabrication. Overlay problems anticipated for next generation via and plug patterning may be addressed by one or more approaches described herein.

In an exemplary embodiment, approaches described below build on approaches using so-called "photobuckets," in which every possible feature, e.g. via, is re-patterned into a substrate. Then, a photoresist is filled into patterned features and the lithography operation is merely used to choose select vias for via opening formation. In a particular embodiment described below, a lithography operation is used to define a relatively large hole above a plurality of "multicolored photobuckets," which can then be opened up by a flood exposure of a particular wavelength. The multicolored photobucket approach allows for larger critical dimensions (CDs) and/or errors in overlay while retaining the ability to choose the via of interest. In one such embodiment, a trench is used to contain the resist itself and multiple wavelengths of flood exposure are used to selectively open the vias of interest.

To provide context, current fabrication techniques for vias involves a "blind" process in which a via opening is patterned in a stack far above an ILD trench. The via opening pattern is then etched deep down into the trench. Overlay errors accumulate and can cause various problems, e.g., shorts to neighboring metal lines. In an example, patterning and aligning of features at less than approximately 50 nanometer pitch requires many reticles and critical alignment strategies that are otherwise extremely expensive for a semiconductor manufacturing process. In an embodiment, by contrast, approaches described herein enable fabrication of self-aligned plugs and/or vias, greatly simplifying the web of overlay errors, and leaving only one critical overlay step (Mx+1 grating). In an embodiment, then, offset due to conventional lithograph/dual damascene patterning that must otherwise be tolerated, is not a factor for the resulting structures described herein.

In general, one or more embodiments are directed to an approach that employs a subtractive technique to ultimately form conductive vias and, possibly, non-conductive spaces or interruptions between metals (referred to as "plugs"). Vias, by definition, are used to land on a previous layer metal pattern. In this vein, embodiments described herein enable a more robust interconnect fabrication scheme since alignment by lithography equipment is no longer relied on. Such an interconnect fabrication scheme can be used to save numerous alignment/exposures, can be used to improve electrical contact (e.g., by reducing via resistance), and can be used to reduce total process operations and processing time otherwise required for patterning such features using conventional approaches.

More specifically, one or more embodiment described herein involves the use of a subtractive method to pre-form every via or via opening using the trenches already etched. An additional operation is then used to select which of the vias and plugs to retain. Such operations can be illustrated using "photobuckets," although the selection process may also be performed using a more conventional resist expose and ILD backfill approach.

In a first aspect, a self-aligned via opening approach is used. As an example, FIGS. 1A-1H illustrate portions of integrated circuit layers representing various operations in a method of subtractive self-aligned via patterning using multi-colored photobuckets, in accordance with an embodiment of the present invention. In each illustration at each described operation, cross-sectional views are shown.

Figure 1A:
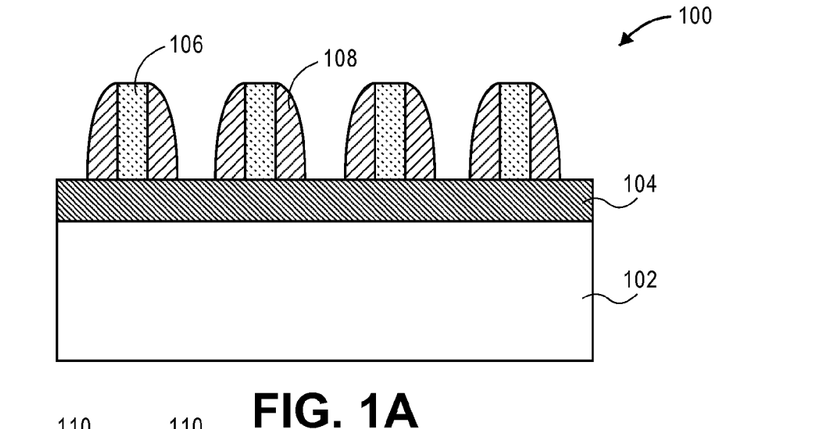
FIG. 1A illustrates a cross-sectional view of a starting structure following deposition, but prior to patterning, of a hardmask material layer formed on an interlayer dielectric (ILD) layer.

FIG. 1A illustrates a cross-sectional view of a starting structure 100 following deposition, but prior to patterning, of a first hardmask material layer 104 formed on an interlayer dielectric (ILD) layer 102, in accordance with an embodiment of the present invention. Referring to FIG. 1A, a patterned mask 106 has spacers 108 formed along sidewalls thereof, on or above the first hardmask material layer 104.

Figure 1B:
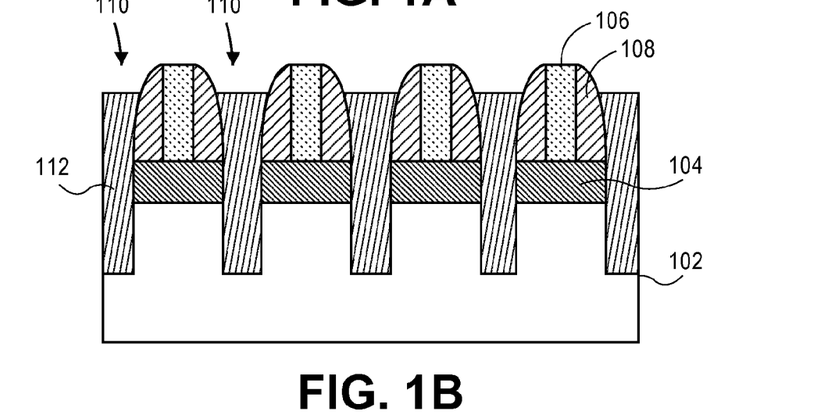
FIG. 1B illustrates the structure of FIG. 1A following first time patterning of the first hardmask layer and subsequent first color photobucket fill.

FIG. 1B illustrates the structure of FIG. 1A following first time patterning of the first hardmask layer and subsequent first color photobucket fill, in accordance with an embodiment of the present invention. Referring to FIG. 1B, the patterned mask 106 and corresponding spacers 108 are used together as a mask during an etch to form trenches 110 through the first hardmask material layer 104 and partially into the ILD layer 102. The trenches 110 are then filled with first color photobuckets 112.

Figure 1C:
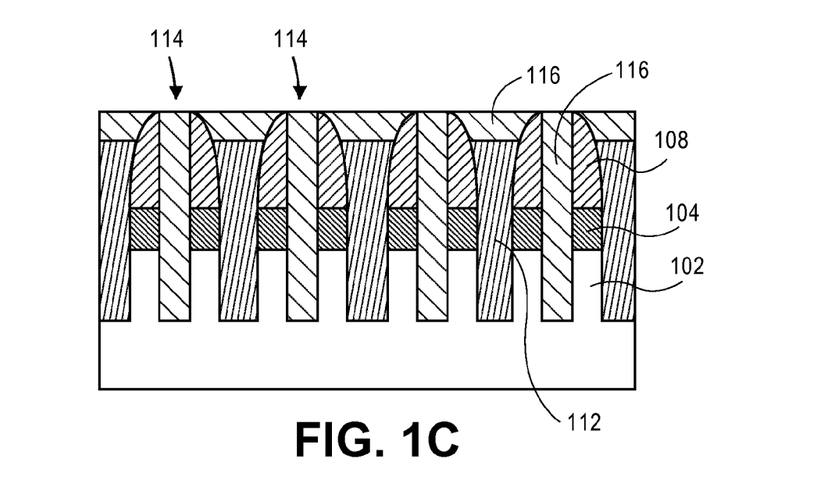
FIG. 1C illustrates the structure of FIG. 1B following second time patterning of the first hardmask layer and subsequent second color photobucket fill.

FIG. 1C illustrates the structure of FIG. 1B following second time patterning of the first hardmask layer and subsequent second color photobucket fill, in accordance with an embodiment of the present invention. Referring to FIG. 1C, the patterned mask 106 is removed and a second plurality of trenches 114 is etched through the first hardmask material layer 104 and partially into the ILD layer 102, between spacers 108. Subsequently, the trenches 114 are filled with a second color photobucket material layer 116.

Referring again to FIG. 1C, the negative pattern of the spacers 108 is thus transferred, e.g., by two etch processes forming trenches 110 and 114, to the first hardmask material layer 104. In one such embodiment, the spacers 108 and, hence, the trenches 110 and 114 are formed with a grating pattern, as is depicted in FIG. 1C. In an embodiment, the grating pattern is a tight pitch grating pattern. In a specific such embodiment, the tight pitch is not achievable directly through conventional lithography. For example, a pattern based on conventional lithography may first be limited to mask 106, but the pitch may be halved by the use of negative spacer mask patterning, as is depicted in FIGS. 1A-1C. Even further, although not shown, the original pitch may be quartered by a second round of spacer mask patterning. Accordingly, the grating-like pattern of the photobuckets 112 and 116, collectively, is spaced at a constant pitch and has a constant width.

Figure 1D:
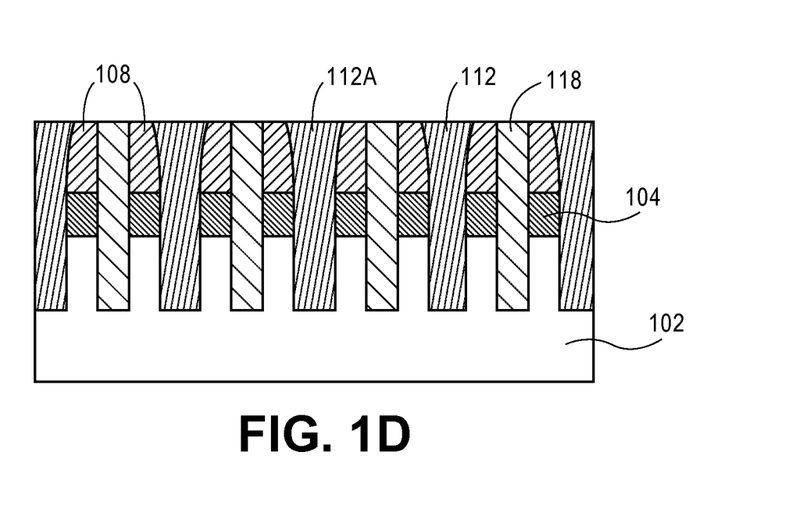
FIG. 1D illustrates the structure of FIG. 1C following planarization to isolate the first and second color photobuckets from one another.

FIG. 1D illustrates the structure of FIG. 1C following planarization to isolate the first and second color photobuckets from one another, in accordance with an embodiment of the present invention. Referring to FIG. 1D, the second color photobucket material layer 116 and the top portions of the spacers 108 are planarized, e.g., by chemical mechanical polishing (CMP), until the top surfaces of the first color photobuckets 112 are exposed, forming discrete second color photobuckets 118 from the photobucket material layer 116. In one embodiment, the combination of first color photobuckets 112 and second color photobuckets 118 represent all possible via locations in a subsequently formed metallization structure.

Figure 1E:
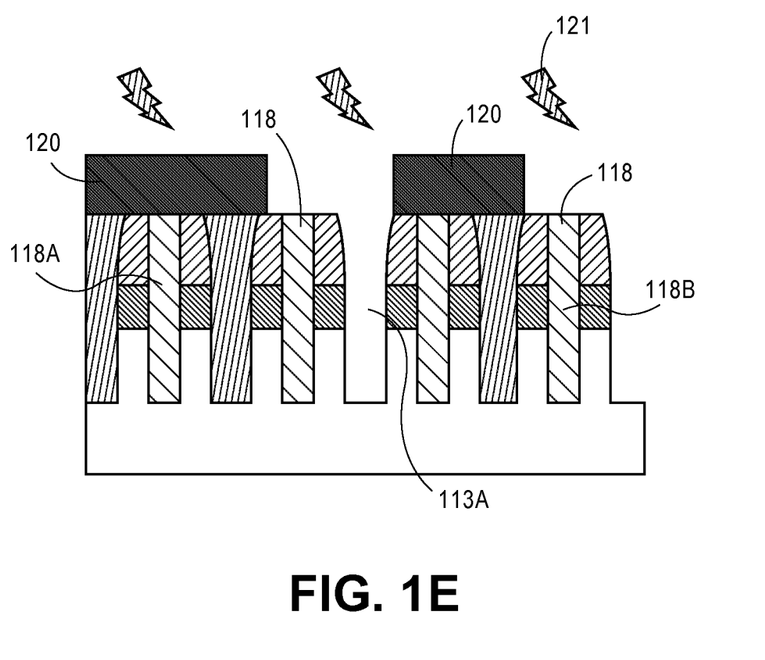
FIG. 1E illustrates the structure of FIG. 1D following exposure and development of a first color photobucket to leave a selected via location.

FIG. 1E illustrates the structure of FIG. 1D following exposure and development of a first color photobucket to leave a selected via location, in accordance with an embodiment of the present invention. Referring to FIG. 1E, a second hardmask 120 is formed and patterned on the structure of FIG. 1D. The patterned second hardmask 120 reveals a selected first color photobucket 112A. The selected photobucket 112A is exposed to light irradiation and removed (i.e., developed) to provide a selected via opening 113A. It is to be appreciated that description herein concerning forming and patterning a hardmask layer involves, in an embodiment, mask formation above a blanket hardmask later. The mask formation may involve use of one or more layers suitable for lithographic processing. Upon patterning the one or more lithographic layers, the pattern is transferred to the hardmask layer by an etch process to provide a patterned hardmask layer.

Referring again to FIG. 1E, it may not be possible to reveal only the selected photobucket 112A upon patterning of the second hardmask layer 120. For example, one or more adjacent (or nearby) second color photobuckets 118 may also be revealed. These additionally revealed photobuckets may not be desirable locations for ultimate via formation. However, any revealed second color photobuckets 118 are, in an embodiment, not modified upon exposure to the irradiation used to for patterning the group of first color photobuckets 112. For example, in one embodiment, the first color photobuckets 112 are susceptible to red flood exposure 121 and can be developed to remove select of the first color photobuckets 112, as is shown in FIG. 1E. In that embodiment, the second color photobuckets 118 are not susceptible to red flood exposure and, thus, cannot be developed and removed even if revealed during the red flood exposure, as is shown in FIG. 1E. In an embodiment, by having neighboring photobuckets of different irradiation susceptibility, larger patterns and/or offset tolerance may be accommodated to relax the restrictions otherwise associated with patterning the second hardmask layer 120.

Figure 1F:
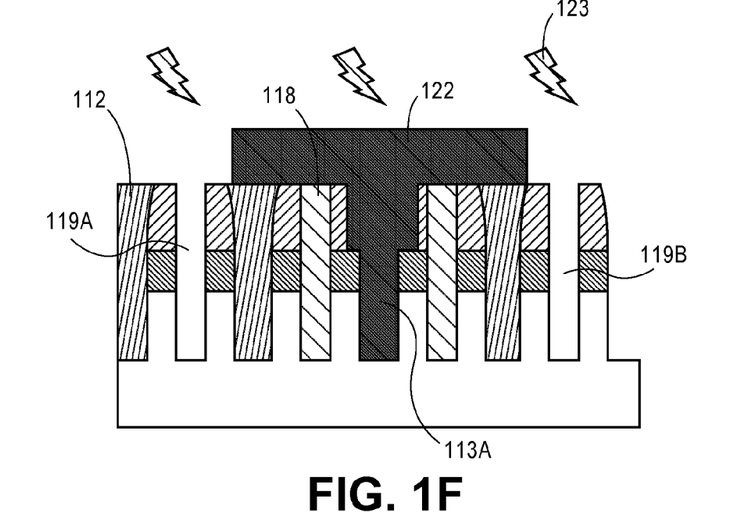
FIG. 1F illustrates the structure of FIG. 1E following exposure and development of a second color photobucket to leave an additional selected via location.

FIG. 1F illustrates the structure of FIG. 1E following exposure and development of a second color photobucket to leave an additional selected via location, in accordance with an embodiment of the present invention. Referring to FIG. 1F, a third hardmask 122 is formed and patterned on the structure of FIG. 1E. The third hardmask 122 may also fill the selected via opening 113A, as is depicted in FIG. 1F. The patterned third hardmask 122 reveals selected second color photobuckets 118A and 118B. The selected photobuckets 118A and 118B are exposed to light irradiation and removed (i.e., developed) to provide selected via openings 119A and 119B, respectively.

Referring again to FIG. 1F, it may not be possible to reveal only the selected photobuckets 118A and 118B upon patterning of the third hardmask layer 122. For example, one or more adjacent (or nearby) first color photobuckets 112 may also be revealed. These additionally revealed photobuckets may not be desirable locations for ultimate via formation. However, any revealed first color photobuckets 112 are, in an embodiment, not modified upon exposure to the irradiation used to for patterning the group of second color photobuckets 118. For example, in one embodiment, the second color photobuckets 118 are susceptible to green flood exposure 123 and can be developed to remove select of the second color photobuckets 118, as is shown in FIG. 1F. In that embodiment, the first color photobuckets 112 are not susceptible to green flood exposure and, thus, cannot be developed and removed even if revealed during the green flood exposure, as is shown in FIG. 1F. In an embodiment, by having neighboring photobuckets of different irradiation susceptibility, larger patterns and/or offset tolerance may be accommodated to relax the restrictions otherwise associated with patterning the third hardmask layer 122.

Figure 1G:
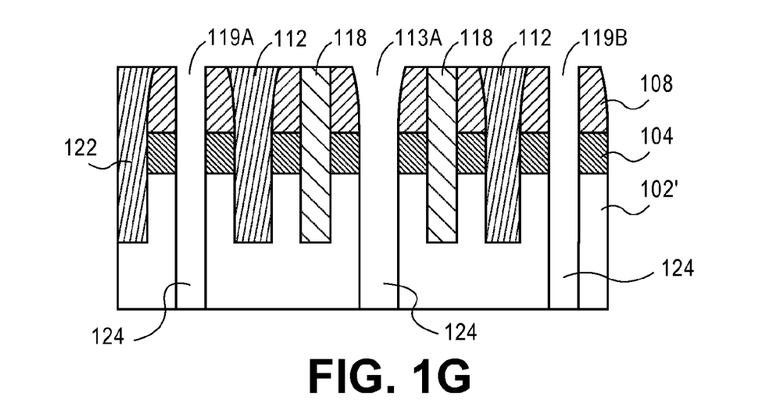
FIG. 1G illustrates the structure of FIG. 1F following removal of the third hardmask layer and etching to form via locations.

FIG. 1G illustrates the structure of FIG. 1F following removal of the third hardmask layer and etching to form via locations, in accordance with an embodiment of the present invention. Referring to FIG. 1G, the third hardmask layer 122 is removed. In one such embodiment, the third hardmask layer 122 is a carbon-based hardmask layer and is removed by an ashing process. Then, the pattern of the via openings 119A, 113A and 119B are subjected to a selective etch process, such as a selective plasma etch process, to extend the via openings deeper into the underlying ILD layer 102, forming via patterned ILD layer 102' with via locations 124. The etching is selective to remaining photobuckets 112 and 118 and to the spacers 108.

Figure 1H:
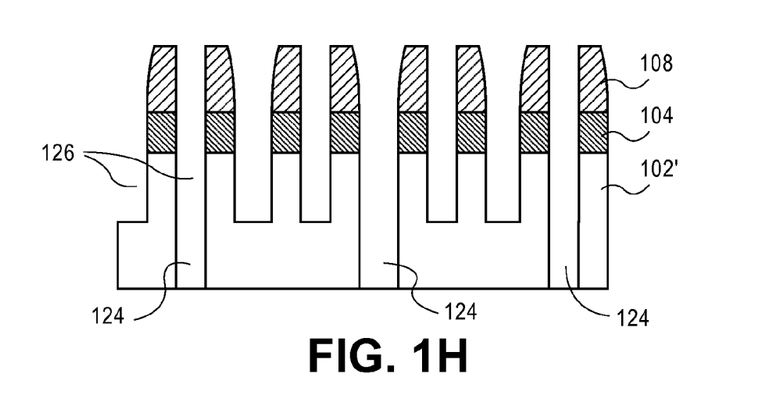
FIG. 1H illustrates the structure of FIG. 1G prior to metal fill.

FIG. 1H illustrates the structure of FIG. 1G prior to metal fill, in accordance with an embodiment of the present invention. Referring to FIG. 1H, all remaining first color and second color photobuckets 112 and 118 are removed. The remaining first color and second color photobuckets 112 and 118 may be removed directly, or may first be exposed and developed to enable removal. The removal of the remaining first color and second color photobuckets 112 and 118 provides metal line trenches 126, some of which are coupled to via locations 124 in patterned ILD layer 102'. Subsequent process can include removal of spacers 108 and hardmask layer 104, and metal fill of metal line trenches 126 and via locations 124. In one such embodiment, metallization is formed by a metal fill and polish back process.

The structure of FIG. 1H, upon metal fill, may subsequently be used as a foundation for forming subsequent metal line/via and ILD layers. Alternatively, the structure of FIG. 1H, upon metal fill, may represent the final metal interconnect layer in an integrated circuit. It is to be appreciated that the above process operations may be practiced in alternative sequences, not every operation need be performed and/or additional process operations may be performed. Referring again to FIG. 1H, self-aligned fabrication by the subtractive approach may be complete at this stage. A next layer fabricated in a like manner likely requires initiation of the entire process once again. Alternatively, other approaches may be used at this stage to provide additional interconnect layers, such as conventional dual or single damascene approaches.

Referring again to FIGS. 1A-1H, several options may be considered as viable for providing first color photobuckets 112 and second color photobuckets 118. For example, in an embodiment, two different positive tone organic photoresists are used. It is to be appreciated that in one such embodiment, materials with different chemical structures can be selected for first color photobuckets 112 and second color photobuckets 118 to allow for different coating, photoactivation and development processes to be used. As an exemplary embodiment, a conventional 193 nm litho poly-methacrylate resist system is chosen for first color photobuckets 112, while a conventional 248 nm poly-hydroxystyrene photoresist system is chosen for the second color photobuckets 118. The significant chemical differences between these two types of resins allow two different organic casting solvents to be used; this may be necessary since the material of the second color photobuckets 118 is coated with the material of the first color photobuckets 112 already present. The casting solvent for the first color photobuckets 112 is not limited, while for the second color photobuckets 118, alcoholic solvents could be used as they still can solubilize PHS materials but not less polar poly-methacrylates.

The combination of a poly-methacrylate resin as the material of the first color photobuckets 112 and a poly-hydroxystyrene resin as the material of the second color photobuckets 118 can, in an embodiment, enable two different exposure wavelengths to be used. Typical 193 nm litho polymers are based on poly-methacrylates with 193 nm absorbing photo acid generator (PAG) since the polymer does not absorb strongly at this wavelength. Poly-hydroxystyrenes, on the other hand, may not be appropriate since they absorb 193 nm strongly and prevent activation of PAG throughout the film. In one embodiment, then, the material of the first color photobuckets 112 can be selectively activated and developed in the presence of 193 nm photons. In order to accentuate photospeed differences between the first color photobuckets 112 and the second color photobuckets 118, factors such as PAG absorbance at 193 nm, PAG loading and photoacid strength can be tuned for each. Additionally, strong 193 nm absorbers can be added to the second color photobuckets 118 (or deposited selectively on top of the second color photobuckets 118) to decrease PAG activation within the bulk of the film. Following exposure, in a particular embodiment, development of the first color photobuckets 112 selectively is carried out with standard TMAH developer where minimal development of the second color photobuckets 118 will occur.

In an embodiment, in order to selectively remove the second color photobuckets 118 in presence of the first color photobuckets 112, a second lower energy wavelength is used which only activates PAG in the second color photobuckets 118 and not in the first color photobuckets 112. This can be achieved in two ways. First, in one embodiment, PAGs with differing absorbance characteristics are used. For example, trialkylsulfonium salts have very low absorbance at wavelengths such as at 248 nm, whereas triarylsulfoniums have very high absorbance. Thus, selectivity is achieved by using triarylsulfonium or other 248 nm absorbing PAGs in the second color photobuckets 118 while using trialkylsulfonium or other non-248 nm absorbing PAG in the first color photobuckets 112. Alternatively, a sensitizer can be incorporated into the second color photobuckets 118 which absorbs low energy photons transferring energy to PAG selectively in the second color photobuckets 118 with no activation occurring in the first color photobuckets 112, since there is no sensitizer present.

Figure 2:
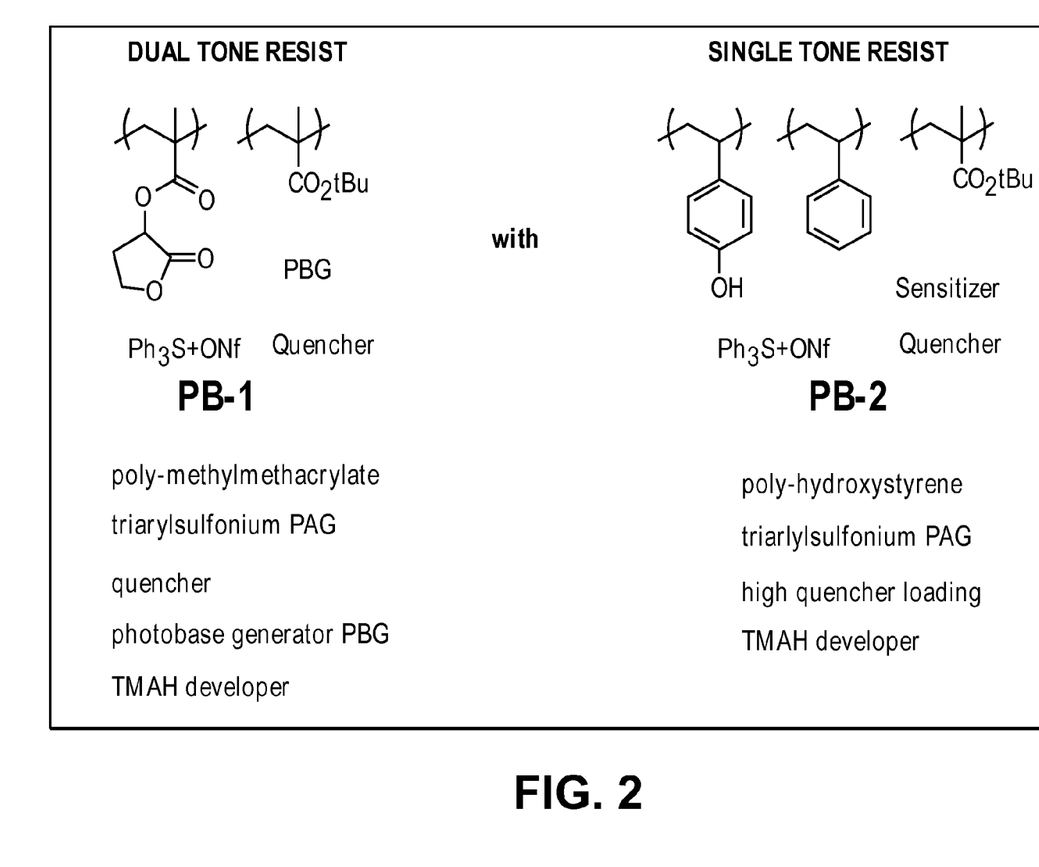
FIG. 2 illustrates an exemplary dual tone resist for one photobucket type and an exemplary single tone resist for another photobucket type, in accordance with an embodiment of the present invention.

In another embodiment, FIG. 2 illustrates an exemplary dual tone resist for one photobucket type and an exemplary single tone resist for another photobucket type, in accordance with an embodiment of the present invention. Referring to FIG. 2, in one embodiment, a dual tone photoresist system (PB-1) is used for the material of the first color photobuckets 112. A single tone (slow) photoresist system (PB-2) is used for the material of the second color photobuckets 118. A dual tone photoresist may be characterized as having a photoresponse that is effectively turned off at higher doses due to activation of photobase generators included in system. The photogenerated base neutralizes photoacid and prevents polymer deprotection. In an embodiment, during exposure of the first color photobuckets 112, dose is selected such that dual tone resist (PB-1) is operating as a fast positive tone system, whereas single tone resist (PB-2) has not received sufficient photons for solubility switch to be activated. This allows PB-1 to be removed with TMAH developer without removal of PB-2. In order to selectively remove PB-2 without removing PB-1, a higher dose is used for the second exposure (i.e., exposure of the second color photobuckets 118). The dose selected needs to both activate sufficient PAG in PB-2 to allow dissolution in TMAH and move PB-2 into negative tone response regime through activation of PBG. In this scheme, the same PAGs can be used for PB-1 and PB-2 and the same exposure wavelengths can be used for exposures 1 and 2. It is to be appreciated that PB-1 may require incorporation of photobase generator (PBG); however, it is likely that different types of polymers will be needed to allow coating of PB-2 once PB-1 is already coated. As described above, utilization of poly-methylmethacrylate type resist for PB-1 and PHS-type for PB-2 could satisfy this requirement.

It is to be appreciated that the above designated materials for first and second color photobuckets 112 and 118, respectively, could be switched, in accordance with embodiments of the present invention. Also, the above multi-color photobucket approach can be referred to as 1-D. Similar approaches could be applied to 2-D systems using crossed gratings, although the photobucket material would have to withstand the etch and cleans from the crossed grating above. The result would be a checkerboard-type pattern with smaller vias/plugs in the perpendicular direction versus those in the approach described above. Additionally, it is to be appreciated that the approaches described in association with FIGS. 1A-1H are not necessarily performed as forming vias aligned to an underlying metallization layer. As such, in some contexts, these process schemes could be viewed as involving blind shooting in the top down direction with respect to any underlying metallization layers. In a second aspect, a subtractive approach provides alignment with an underlying metallization layer. As an example, FIGS. 3A-3I illustrate portions of integrated circuit layers representing various operations in a method of subtractive self-aligned via patterning using multi-colored photobuckets, in accordance with another embodiment of the present invention. In each illustration at each described operation, an angled three-dimensional cross-section view is provided.

Figure 3A:
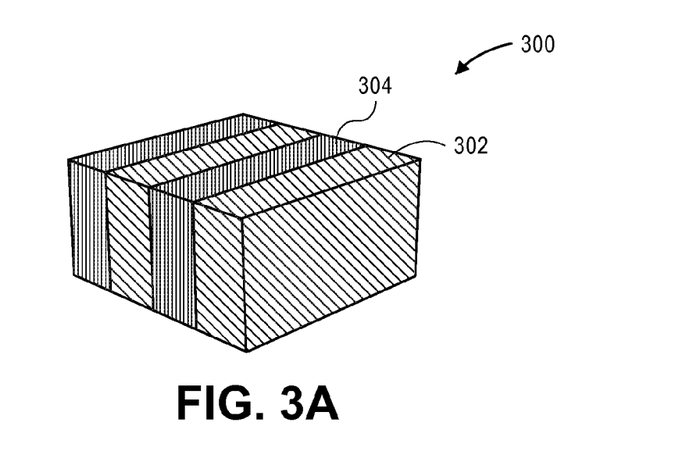
FIG. 3A illustrates a starting point structure for a subtractive via process following deep metal line fabrication.

FIG. 3A illustrates a starting point structure 300 for a subtractive via process following deep metal line fabrication, in accordance with an embodiment of the present invention. Referring to FIG. 3A, structure 300 includes metal lines 302 with intervening interlayer dielectric (ILD) lines 304. It is to be appreciated that some of the lines 302 may be associated with underlying vias for coupling to a previous interconnect layer. In an embodiment, the metal lines 302 are formed by patterning trenches into an ILD material (e.g., the ILD material of lines 304). The trenches are then filled by metal and, if needed, planarized to the top of the ILD lines 304. In an embodiment, the metal trench and fill process involves high aspect ratio features. For example, in one embodiment, the aspect ratio of metal line height (h) to metal line width (w) is approximately in the range of 5-10.

Figure 3B:
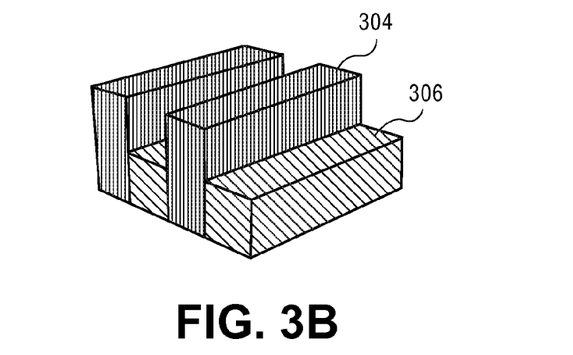
FIG. 3B illustrates the structure of FIG. 3A following recessing of the metal lines.

FIG. 3B illustrates the structure of FIG. 3A following recessing of the metal lines, in accordance with an embodiment of the present invention. Referring to FIG. 3B, the metal lines 302 are recessed selectively to provide first level metal lines 306. The recessing is performed selectively to the ILD lines 304. The recessing may be performed by etching through dry etch, wet etch, or a combination thereof. The extent of recessing may be determined by the targeted thickness of the first level metal lines 306 for use as suitable conductive interconnect lines within a back end of line (BEOL) interconnect structure.

Figure 3C:
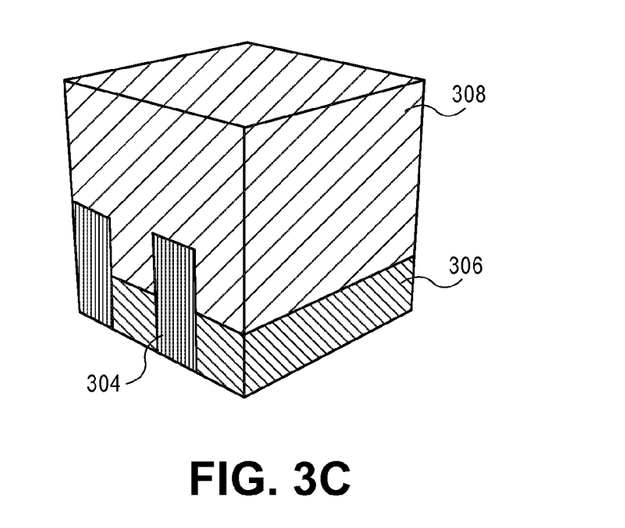
FIG. 3C illustrates the structure of FIG. 3B following formation of an inter layer dielectric (ILD) layer.

FIG. 3C illustrates the structure of FIG. 3B following formation of an inter layer dielectric (ILD) layer, in accordance with an embodiment of the present invention. Referring to FIG. 3C, an ILD material layer 308 is deposited and, if necessary, planarized, to a level above the recessed metal lines 306 and the ILD lines 304.

Figure 3D:
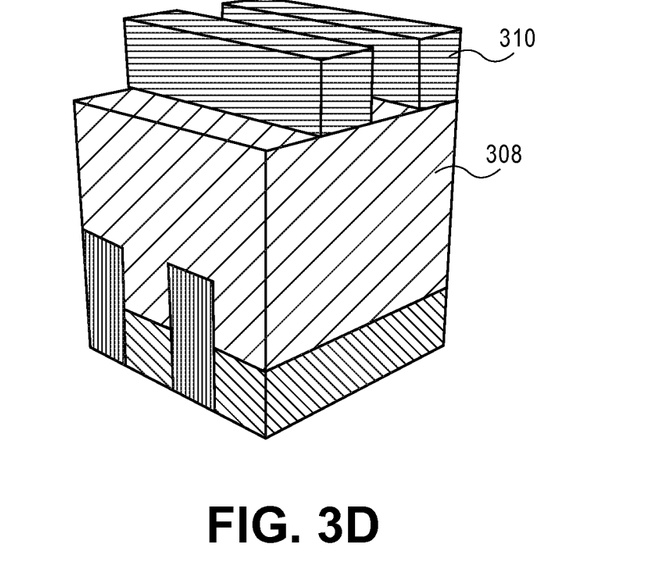
FIG. 3D illustrates the structure of FIG. 3C following deposition and patterning of a hardmask layer.

FIG. 3D illustrates the structure of FIG. 3C following deposition and patterning of a hardmask layer, in accordance with an embodiment of the present invention. Referring to FIG. 3D a hardmask layer 310 is formed on the ILD layer 308. In one such embodiment, the hardmask layer 310 is formed with a grating pattern orthogonal to the grating pattern of the first level metal lines 306/ILD lines 304, as is depicted in FIG. 3D. In an embodiment, the grating structure formed by the hardmask layer 310 is a tight pitch grating structure. In one such embodiment, the tight pitch is not achievable directly through conventional lithography. For example, a pattern based on conventional lithography may first be formed, but the pitch may be halved by the use of spacer mask patterning. Even further, the original pitch may be quartered by a second round of spacer mask patterning. Accordingly, the grating-like pattern of the second hardmask layer 310 of FIG. 3D may have hardmask lines spaced at a constant pitch and having a constant width.

Figure 3E:
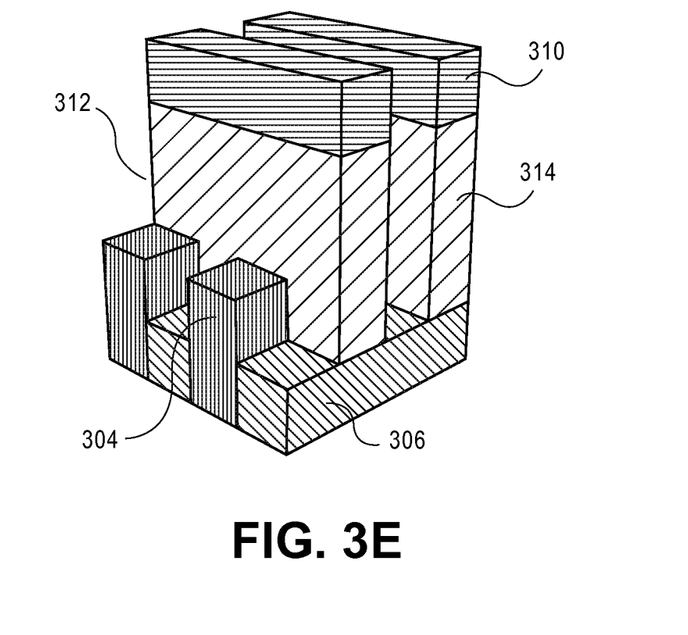
FIG. 3E illustrates the structure of FIG. 3D following trench formation defined using the pattern of the hardmask of FIG. 3D.

FIG. 3E illustrates the structure of FIG. 3D following trench formation defined using the pattern of the hardmask of FIG. 3D, in accordance with an embodiment of the present invention. Referring to FIG. 3E, the exposed regions (i.e., unprotected by 310) of the ILD layer 308 are etched to form trenches 312 and patterned ILD layer 314. The etch stops on, and thus exposes, the top surfaces of the first level metal lines 306 and the ILD lines 304.

Figure 3F:
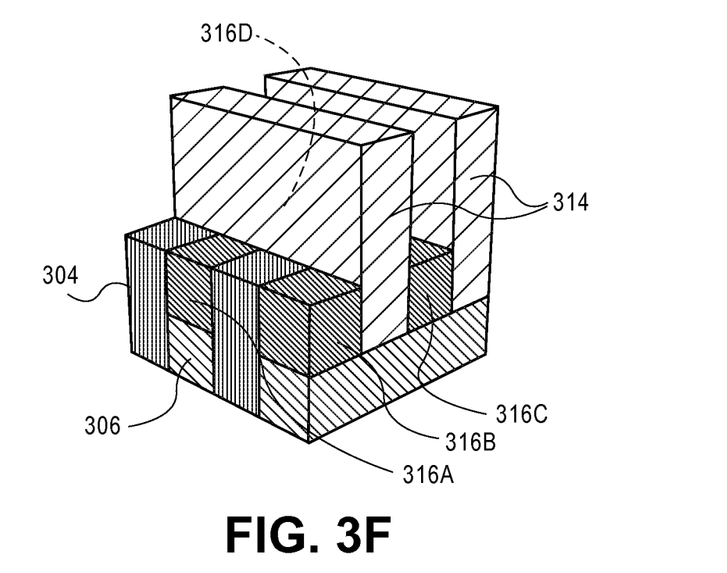
FIG. 3F illustrates the structure of FIG. 3E following multi-colored photobucket formation in all possible via locations.

FIG. 3F illustrates the structure of FIG. 3E following photobucket formation in all possible via locations, in accordance with an embodiment of the present invention. Referring to FIG. 3F, photobuckets 316 are formed in all possible via locations above exposed portions of the recessed metal lines 306. In one embodiment, the photobuckets 316 are formed essentially co-planar with the top surfaces of the ILD lines 304, as depicted in FIG. 3F. Additionally, referring again to FIG. 3F, the hardmask layer 310 may be removed from the patterned ILD layer 314.

Referring again to FIG. 3F, in an embodiment, two different colors of photobuckets may be sued to form photobuckets 316. For example, in one embodiment, photobuckets 316A and 316 C are composed of a first photobucket material, while photobuckets 316B and 316D are composed of a second, different, photobucket material, as described above. The use of two different photobuckets at this stage may ease constraints on subsequent lithography used to expose select photobuckets.

Figure 3G:
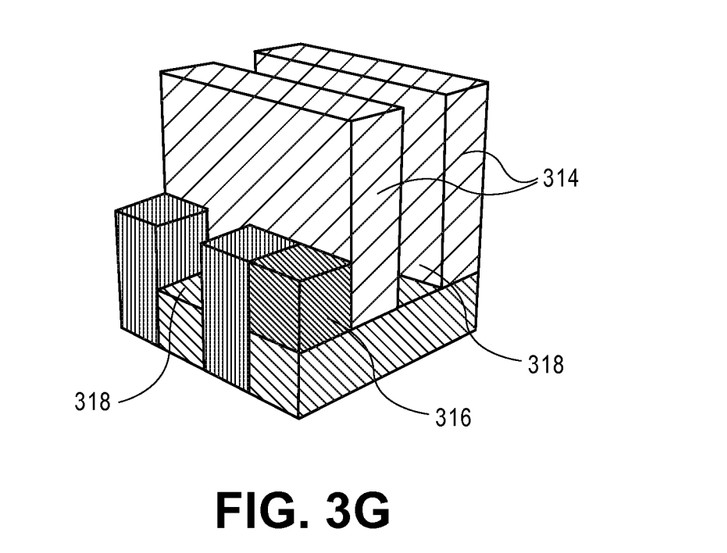
FIG. 3G illustrates the structure of FIG. 3F following via location selection.

FIG. 3G illustrates the structure of FIG. 3F following via location selection, in accordance with an embodiment of the present invention. Referring to FIG. 3G, the photobuckets 316 from FIG. 3F in select via locations 318 are removed. In locations where vias are not selected to be formed, the photobuckets 316 are retained. In one embodiment, in order to form via locations 318, lithography is used to expose the corresponding photobuckets 316. The exposed photobuckets may then be removed by a developer.

Referring again to FIG. 3G, in relationship to FIG. 3F, via selection may involve removal of one or more of a first photobucket type and removal of one or more of a second photobucket type. Although in FIG. 3G, the two photobuckets 316A and 316C of the same type are removed, this need not be the case. As such, in an embodiment, at least some photobuckets of the first color type are retained along with at least some of the second, different color type.

Figure 3H:
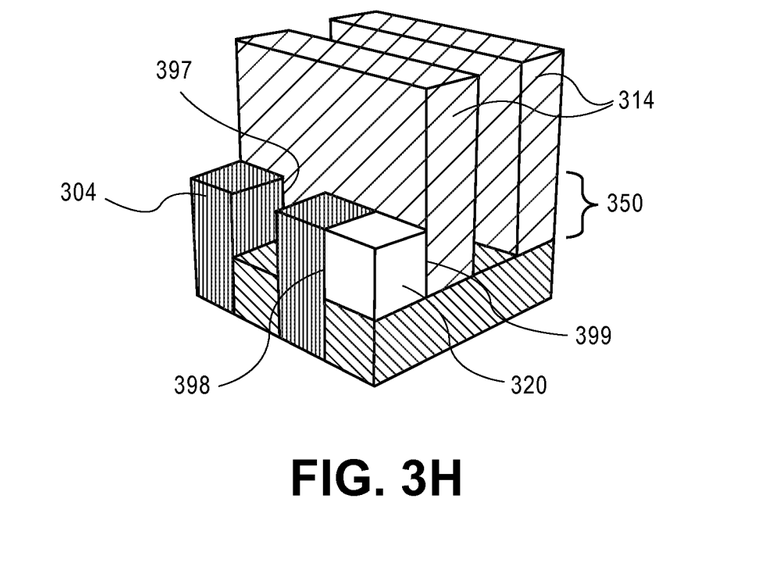
FIG. 3H illustrates the structure of FIG. 3G following conversion of the remaining photobuckets to permanent ILD material.

FIG. 3H illustrates the structure of FIG. 3G following conversion of the remaining photobuckets to permanent ILD material, in accordance with an embodiment of the present invention. Referring to FIG. 3H, the material of the photobuckets 316 is modified, e.g., by cross-linking upon a baking operation, in the locations to form a final ILD material 320. In one such embodiment, the cross-linking provides for a solubility switch upon the baking. The final, cross-linked material has inter-dielectric properties and, thus, can be retained in a final metallization structure. In an embodiment, two different types of photobuckets (e.g., photobuckets of a first and second color) are retained and are thus converted to two different materials, respectively, that may be retained in the final metallization structure.

Referring again to FIG. 3H, in an embodiment, the resulting structure includes up to three different dielectric material regions (ILD lines 304+ILD lines 314+cross-linked photobucket 320) in a single plane 350 of the metallization structure. In one such embodiment, two or all of ILD lines 304, ILD lines 314, and cross-linked photobucket 320 are composed of a same material. In another such embodiment, ILD lines 304, ILD lines 314, and cross-linked photobucket 320 are all composed of different ILD materials. In either case, in a specific embodiment, a distinction such as a vertical seam between the materials of ILD lines 304 and ILD lines 314 (e.g., seam 397) and/or between ILD lines 304 and cross-linked photobucket 320 (e.g., seam 398) and/or between ILD lines 314 and cross-linked photobucket 320 (e.g., seam 399) may be observed in the final structure. Furthermore, in an embodiment, cross-linked photobucket 320 can represent one of two different types of cross-linked photobuckets retained in the final structure.

Figure 3I:
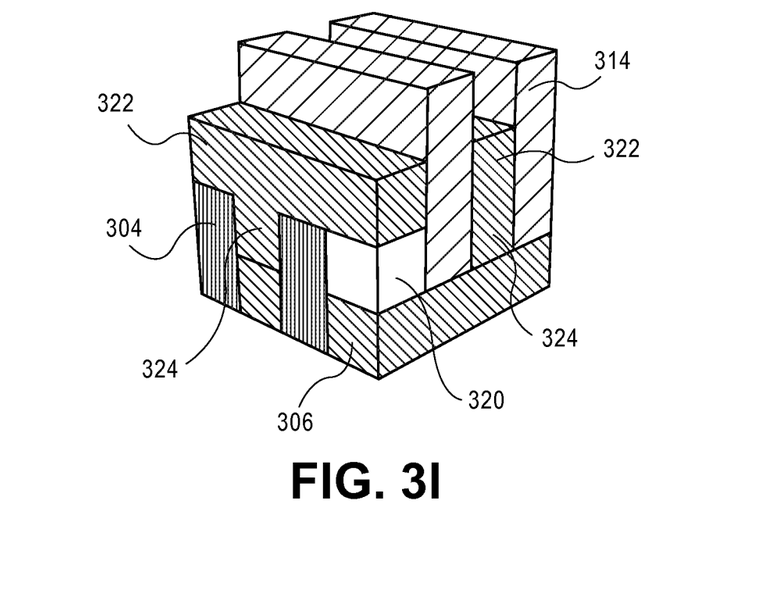
FIG. 3I illustrates the structure of FIG. 3H following metal line and via formation.

FIG. 3I illustrates the structure of FIG. 3H following metal line and via formation, in accordance with an embodiment of the present invention. Referring to FIG. 3I, metal lines 322 and vias 324 are formed upon metal fill of the openings of FIG. 3H. The metal lines 322 are coupled to the underlying metal lines 306 by the vias 324. In an embodiment, the openings are filled in a damascene approach or a bottom-up fill approach to provide the structure shown in FIG. 3I. Thus, the metal (e.g., copper and associated barrier and seed layers) deposition to form metal lines and vias in the above approach may be that typically used for standard back end of line (BEOL) processing. In an embodiment, in subsequent fabrication operations, the ILD lines 314 may be removed to provide air gaps between the resulting metal lines 324.

The structure of FIG. 3I may subsequently be used as a foundation for forming subsequent metal line/via and ILD layers. Alternatively, the structure of FIG. 3I may represent the final metal interconnect layer in an integrated circuit. It is to be understood that the above process operations may be practiced in alternative sequences, not every operation need be performed and/or additional process operations may be performed. In any case, the resulting structures enable fabrication of vias that are directly centered on underlying metal lines. That is, the vias may be wider than, narrower than, or the same thickness as the underlying metal lines, e.g., due to non-perfect selective etch processing. Nonetheless, in an embodiment, the centers of the vias are directly aligned (match up) with the centers of the metal lines. Furthermore, the ILD used to select which plugs and vias will likely be very different from the primary ILD and will be perfectly self-aligned in both directions. As such, in an embodiment, offset due to conventional lithograph/dual damascene patterning that must otherwise be tolerated, is not a factor for the resulting structures described herein. Referring again to FIG. 3I, then, self-aligned fabrication by the subtractive approach may be complete at this stage. A next layer fabricated in a like manner likely requires initiation of the entire process once again. Alternatively, other approaches may be used at this stage to provide additional interconnect layers, such as conventional dual or single damascene approaches.

Overall, in accordance with one or more embodiments of the present invention, approaches described herein involve use of photobucket interlayer dielectric (ILD) to select locations for plugs and vias. The photobucket ILD composition is typically very different from standard ILD and, in one embodiment, is perfectly self-aligned in both directions. More generally, in an embodiment, the term "photobucket" as used herein involves use of an ultrafast photoresist or ebeam resist or other photosensitive material as formed in etched openings. In one such embodiment, a thermal reflow of a polymer into the openings is used following a spin coat application. In one embodiment, the fast photoresist is fabricated by removing a quencher from an existing photoresist material. In another embodiment, the photobuckets are formed by an etch-back process and/or a lithography/shrink/etch process. It is to be understood that the photobuckets need not be filled with actual photoresist, so long as the material acts as a photosensitive switch. In one embodiment, lithography is used to expose the corresponding photobuckets that are selected for removal. However, the lithographic constraints may be relaxed and misalignment tolerance may be high since the photobuckets are surrounded by non-photolyzable materials. Furthermore, in an embodiment, instead of exposing at, e.g. 30mJ/cm2, such photobuckets might be exposed at, e.g., 3mJ/cm2. Normally this would result in very poor critical dimension (CD) control and roughness. But in this case, the CD and roughness control will be defined by the photobuckets, which can be very well controlled and defined. Thus, the photobucket approach may be used to circumvent imaging/dose tradeoff which limits the throughput of next generation lithographic processes. In one embodiment, the photobuckets are subject to exposure of extreme ultraviolet (EUV) light in order to expose the photobuckets, where in a particular embodiment, EUV exposure is in the range of 5-15 nanometers. The details above regarding FIGS. 1A-1H and 3A-3I focus primarily on multicolored photobucket use for via patterning. However, it is to be appreciated that multi-colored photobuckets may also be used for plug patterning.

In an embodiment, the term "grating structure" for metal lines, ILD lines or hardmask lines is used to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described above may have metal lines, ILD lines or hardmask lines spaced at a constant pitch and having a constant width. The pattern may be fabricated by a pitch halving or pitch quartering approach.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, interconnect material (e.g., metal lines and/or vias) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers, stacks of different metals or alloys, etc. The interconnect lines are also sometimes referred to in the arts as traces, wires, lines, metal, or simply interconnect.

In an embodiment, as is also used throughout the present description, plug and/or cap and/or hardmask materials are composed of dielectric materials different from the interlayer dielectric material. In one embodiment, these materials are sacrificial, while interlayer dielectric materials are preserved at least somewhat in a final structure. In some embodiments, a plug and/or cap and/or hardmask material includes a layer of a nitride of silicon (e.g., silicon nitride) or a layer of an oxide of silicon, or both, or a combination thereof. Other suitable materials may include carbon-based materials. In another embodiment, a plug and/or cap and/or hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other plug and/or cap and/or hardmask material layers known in the arts may be used depending upon the particular implementation. The plug and/or cap and/or hardmask material layers maybe formed by CVD, PVD, or by other deposition methods.

It is to be appreciated that the layers and materials described above are typically formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structures depicted above may be fabricated on underlying lower level back end of line (BEOL) interconnect layers.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 4:
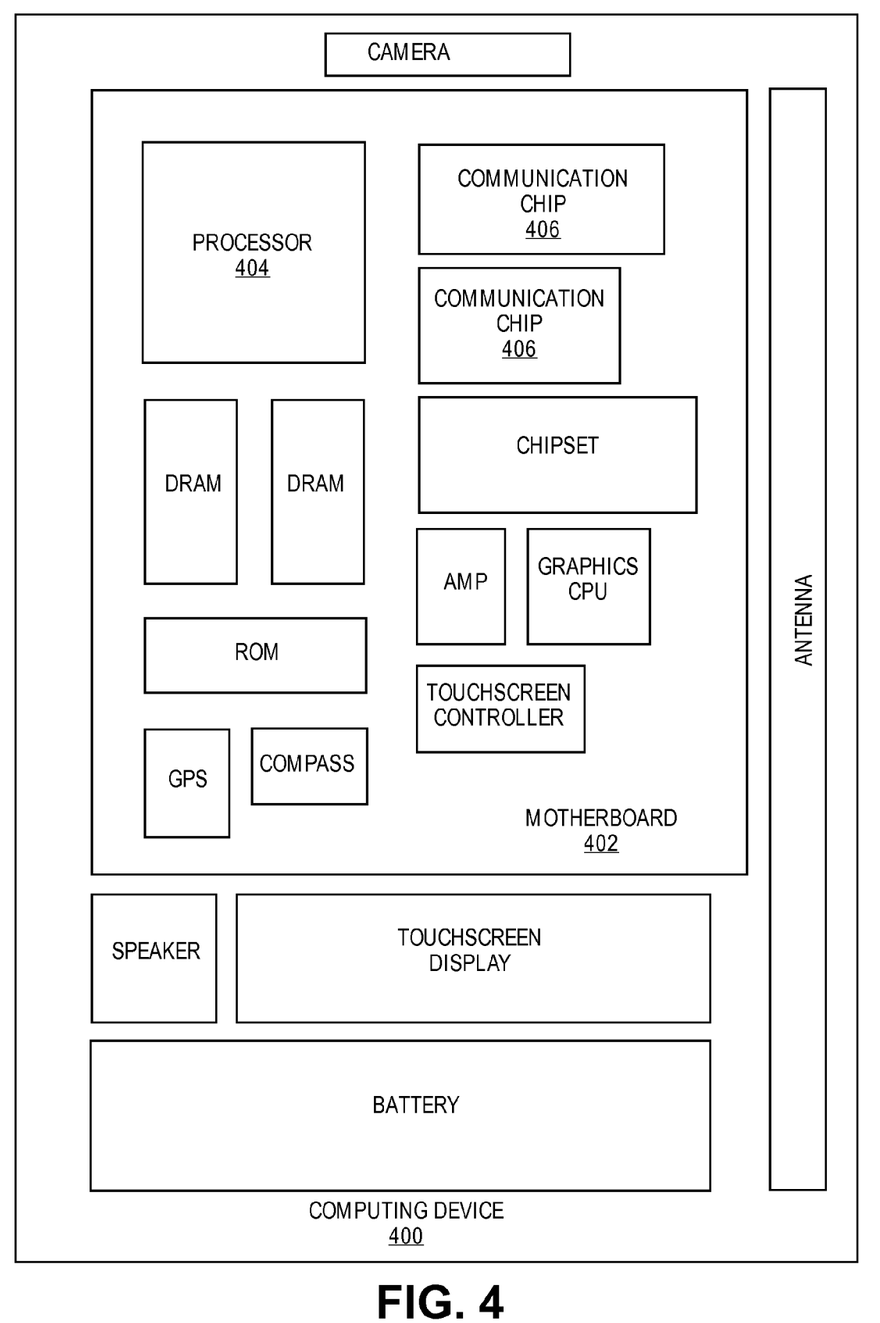
FIG. 4 illustrates a computing device in accordance with one implementation of the invention.

FIG. 4 illustrates a computing device 400 in accordance with one implementation of the invention. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

Depending on its applications, computing device 400 may include other components that may or may not be physically and electrically coupled to the board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. In some implementations of the invention, the integrated circuit die of the processor includes one or more structures, such as self-aligned vias, built in accordance with implementations of the invention. The term "processor" may refer to any device or portion of a device that processes electronic data from registers and/or memory to transform that electronic data into other electronic data that may be stored in registers and/or memory.

The communication chip 406 also includes an integrated circuit die packaged within the communication chip 406. In accordance with another implementation of the invention, the integrated circuit die of the communication chip includes one or more structures, such as self-aligned vias, built in accordance with implementations of the invention.

In further implementations, another component housed within the computing device 400 may contain an integrated circuit die that includes one or more structures, such as self-aligned vias, built in accordance with implementations of the invention.

In various implementations, the computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

Thus, embodiments of the present invention include self-aligned via patterning with multi-colored photobuckets for back end of line (BEOL) interconnects.

In an embodiment, an interconnect structure for an integrated circuit includes a first layer of the interconnect structure disposed above a substrate, the first layer including a first grating of alternating metal lines and dielectric lines in a first direction. The dielectric lines have an uppermost surface higher than an uppermost surface of the metal lines. A second layer of the interconnect structure is disposed above the first layer of the interconnect structure, the second layer including a second grating of alternating metal lines and dielectric lines in a second direction, perpendicular to the first direction. The dielectric lines have a lowermost surface lower than a lowermost surface of the metal lines of the second grating. The dielectric lines of the second grating overlap and contact, but are distinct from, the dielectric lines of the first grating. First and second dielectric regions are disposed between the metal lines of the first grating and the metal lines of the second grating, and in a same plane as upper portions of the dielectric lines of the first grating and lower portions of the dielectric lines of the second grating. The first dielectric region is composed of a first cross-linked photolyzable material, and the second dielectric region is composed of a second, different, cross-linked photolyzable material.

In one embodiment, the first cross-linked photolyzable material is a cross-linked 193 nm poly-methacrylate resist, and the second cross-linked photolyzable material is a cross-linked 248 nm poly-hydroxystyrene resist.

In one embodiment, the first cross-linked photolyzable material is a cross-linked dual tone resist, and the second cross-linked photolyzable material is a cross-linked single tone resist.

In one embodiment, the interconnect structure further includes a conductive via disposed between and coupling a metal line of the first grating to a metal line of the second grating, the conductive via in the same plane as the first and second regions of dielectric material.

In one embodiment, the conductive via has a center directly aligned with a center of the metal line of the first grating and with a center of the metal line of the second grating.

In one embodiment, the dielectric lines of the first grating are composed of a first dielectric material, and the dielectric lines of the second grating are composed of a second, different dielectric material, and the first and second dielectric materials are different than the first and second cross-linked photolyzable materials.

In one embodiment, the dielectric lines of the first grating and the dielectric lines of the second grating are composed of a same dielectric material different than the first and second cross-linked photolyzable materials.

In an embodiment, a method of fabricating an interconnect structure for an integrated circuit involves forming a mask above an ILD material layer, the mask having a plurality of spaced apart features each with a central portion and a pair of sidewall spacers. The method also involves forming, using the mask, a first plurality of trenches partially into the ILD material layer. The method also involves forming first color photobuckets in the first plurality of trenches. The method also involves forming a second mask from the mask by removing the central portion of each feature of the mask. The method also involves forming, using the second mask, a second plurality of trenches partially into the ILD material layer. The method also involves forming second, different, color photobuckets in the second plurality of trenches. The method also involves exposing, developing and removing fewer than all of the first color photobuckets by using a first lithographic exposure. The method also involves exposing, developing and removing fewer than all of the second color photobuckets by using a second, different, lithographic exposure. The method also involves forming via locations where the fewer than all of the first color photobuckets and the fewer than all of the second color photobuckets were removed. The method also involves forming metal vias in the via locations and metal lines above the metal vias.

In one embodiment, the first color photobuckets are composed of 193 nm poly-methacrylate resist and the first lithographic exposure is a 193 nm exposure, and the second color photobuckets are composed of 248 nm poly-hydroxystyrene resist and the second lithographic exposure is a 248 nm exposure.

In one embodiment, the first color photobuckets are composed of a dual tone resist, the second color photobuckets are composed of a single tone resist, and the first and second lithographic exposures involve irradiation by a same wavelength of light at a different dose.

In one embodiment, the method further involves, prior to forming metal vias in the via locations, removing all remaining of the first color and the second color photobuckets.

In one embodiment, at least one of the first and second lithographic exposures is performed in the presence of a carbon-based hardmask layer, and the carbon-based hardmask layer is subsequently removed using an ashing process.

In an embodiment, a method of fabricating an interconnect structure for an integrated circuit involves providing a metallization structure including an alternating metal line and dielectric line first grating having a first direction, each dielectric line of the first grating having a top surface essentially co-planar with a top surface of each metal line. The method also involves recessing the metal lines of the first grating below the top surface of the dielectric lines of the first grating and to form recessed metal lines of the first grating. The method also involves forming an inter layer dielectric (ILD) layer above the dielectric lines and the recessed metal lines of the first grating, the ILD layer having a second grating in a second direction, perpendicular to the first direction, revealing portions of the recessed metal lines. The method also involves forming first color photobuckets in approximately half of all possible via locations above the recessed metal lines. The method also involves forming second, different, color photobuckets in the remaining of all possible via locations above the recessed lines. The method also involves exposing, developing and removing fewer than all of the first and second color photobuckets to form one or more via openings. The method also involves, subsequently, cross-linking all remaining first and second color photobuckets. The method also involves forming metal lines above, and vias in a same plane as, the cross-linked first and second color photobuckets.

In one embodiment, forming the first and second color photobuckets involves forming first and second photolyzable materials, respectively, and cross-linking the remaining first and second color photobuckets involves baking the remaining first and second color photobuckets.

In one embodiment, the first photolyzable material is a 193 nm poly-methacrylate resist, and the second photolyzable material is a 248 nm poly-hydroxystyrene resist.

In one embodiment, the first photolyzable material is a dual tone resist, and the second photolyzable material is a single tone resist.

In one embodiment, cross-linking the remaining first and second color photobuckets involves forming a permanent ILD material.

In one embodiment, exposing, developing and removing fewer than all of the first and second color photobuckets involves exposing, developing and removing fewer than all of the first color photobuckets by using a first lithographic exposure and exposing, developing and removing fewer than all of the second color photobuckets by using a second, different, lithographic exposure. The first color photobuckets are composed of 193 nm poly-methacrylate resist and the first lithographic exposure is a 193 nm exposure, and the second color photobuckets are composed of 248 nm poly-hydroxystyrene resist and the second lithographic exposure is a 248 nm exposure.

In one embodiment, exposing, developing and removing fewer than all of the first and second color photobuckets involves exposing, developing and removing fewer than all of the first color photobuckets by using a first lithographic exposure and exposing, developing and removing fewer than all of the second color photobuckets by using a second, different, lithographic exposure. The first color photobuckets are composed of a dual tone resist, the second color photobuckets are composed of a single tone resist, and the first and second lithographic exposures involve irradiation by a same wavelength of light at a different dose.

In one embodiment, the dielectric lines of the first grating are composed of a first dielectric material, and the ILD layer are composed of a second, different dielectric material.

In one embodiment, the dielectric lines of the first grating and the ILD layer are composed of a same dielectric material.

What is claimed is:

1. An interconnect structure for an integrated circuit, the interconnect structure comprising:
    a first layer of the interconnect structure disposed above a substrate, the first layer comprising a first grating of alternating metal lines and dielectric lines in a first direction, wherein the dielectric lines have an uppermost surface higher than an uppermost surface of the metal lines; and
    a second layer of the interconnect structure disposed above the first layer of the interconnect structure, the second layer comprising a second grating of alternating metal lines and dielectric lines in a second direction, perpendicular to the first direction, wherein the dielectric lines have a lowermost surface lower than a lowermost surface of the metal lines of the second grating, wherein the dielectric lines of the second grating overlap and contact, but are distinct from, the dielectric lines of the first grating; and
    first and second dielectric regions disposed between the metal lines of the first grating and the metal lines of the second grating, and in a same plane as upper portions of the dielectric lines of the first grating and lower portions of the dielectric lines of the second grating, the first dielectric region comprising a first cross-linked photolyzable material, and the second dielectric region comprising a second, different, cross-linked photolyzable material.

2. The interconnect structure of claim 1, wherein the first cross-linked photolyzable material is a cross-linked 193 nm poly-methacrylate resist, and the second cross-linked photolyzable material is a cross-linked 248 nm poly-hydroxystyrene resist.

3. The interconnect structure of claim 1, wherein the first cross-linked photolyzable material is a cross-linked dual tone resist, and the second cross-linked photolyzable material is a cross-linked single tone resist.

4. The interconnect structure of claim 1, further comprising:
    a conductive via disposed between and coupling a metal line of the first grating to a metal line of the second grating, the conductive via in the same plane as the first and second regions of dielectric material.

5. The interconnect structure of claim 4, wherein the conductive via has a center directly aligned with a center of the metal line of the first grating and with a center of the metal line of the second grating.

6. The interconnect structure of claim 1, wherein the dielectric lines of the first grating comprise a first dielectric material, and the dielectric lines of the second grating comprise a second, different dielectric material, and wherein the first and second dielectric materials are different than the first and second cross-linked photolyzable materials.

7. The interconnect structure of claim 1, wherein the dielectric lines of the first grating and the dielectric lines of the second grating comprise a same dielectric material different than the first and second cross-linked photolyzable materials.

8. A method of fabricating an interconnect structure for an integrated circuit, the method comprising:
    providing a metallization structure comprising an alternating metal line and dielectric line first grating having a first direction, each dielectric line of the first grating having a top surface essentially co-planar with a top surface of each metal line;
    recessing the metal lines of the first grating below the top surface of the dielectric lines of the first grating and to form recessed metal lines of the first grating;
    forming an inter layer dielectric (ILD) layer above the dielectric lines and the recessed metal lines of the first grating, the ILD layer having a second grating in a second direction, perpendicular to the first direction, revealing portions of the recessed metal lines;
    forming first color photobuckets in approximately half of all possible via locations above the recessed metal lines;
    forming second, different, color photobuckets in the remaining of all possible via locations above the recessed lines;
    exposing, developing and removing fewer than all of the first and second color photobuckets to form one or more via openings; and, subsequently,
    cross-linking all remaining first and second color photobuckets; and
    forming metal lines above, and vias in a same plane as, the cross-linked first and second color photobuckets.

9. The method of claim 8, wherein forming the first and second color photobuckets comprises forming first and second photolyzable materials, respectively, and wherein cross-linking the remaining first and second color photobuckets comprises baking the remaining first and second color photobuckets.

10. The method of claim 9, wherein the first photolyzable material is a 193 nm poly-methacrylate resist, and the second photolyzable material is a 248 nm poly-hydroxystyrene resist.

11. The method of claim 9, wherein the first photolyzable material is a dual tone resist, and the second photolyzable material is a single tone resist.

12. The method of claim 8, wherein cross-linking the remaining first and second color photobuckets comprises forming a permanent ILD material.

13. The method of claim 8, wherein exposing, developing and removing fewer than all of the first and second color photobuckets comprises exposing, developing and removing fewer than all of the first color photobuckets by using a first lithographic exposure and exposing, developing and removing fewer than all of the second color photobuckets by using a second, different, lithographic exposure, wherein the first color photobuckets comprise 193 nm poly-methacrylate resist and the first lithographic exposure is a 193 nm exposure, and wherein the second color photobuckets comprise 248 nm poly-hydroxystyrene resist and the second lithographic exposure is a 248 nm exposure.

14. The method of claim 8, wherein exposing, developing and removing fewer than all of the first and second color photobuckets comprises exposing, developing and removing fewer than all of the first color photobuckets by using a first lithographic exposure and exposing, developing and removing fewer than all of the second color photobuckets by using a second, different, lithographic exposure, and wherein the first color photobuckets comprise a dual tone resist, the second color photobuckets comprise a single tone resist, and the first and second lithographic exposures involve irradiation by a same wavelength of light at a different dose.

15. The method of claim 8, wherein the dielectric lines of the first grating comprise a first dielectric material, and the ILD layer comprises a second, different dielectric material.

16. The method of claim 8, wherein the dielectric lines of the first grating and the ILD layer comprise a same dielectric material.

* * * * *